United States Patent
Chi et al.

(10) Patent No.: US 9,769,967 B2
(45) Date of Patent: Sep. 19, 2017

(54) SHIELD INSTALLED ON PRINTED CIRCUIT BOARD

(71) Applicant: Samsung Electronics Co., Ltd., Suwon-si (KR)

(72) Inventors: Yun Oh Chi, Suwon-si (KR); Kyung Hoon Song, Yongin-si (KR); Kwang Sub Lee, Yongin-si (KR); Sae Bom Lee, Suwon-si (KR); Se Young Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 3 days.

(21) Appl. No.: 14/843,766

(22) Filed: Sep. 2, 2015

(65) Prior Publication Data

US 2016/0066482 A1 Mar. 3, 2016

(30) Foreign Application Priority Data

Sep. 2, 2014 (KR) .................. 10-2014-0116323

(51) Int. Cl.
*H05K 9/00* (2006.01)

(52) U.S. Cl.
CPC ... *H05K 9/0032* (2013.01); *H05K 2201/0715* (2013.01)

(58) Field of Classification Search
CPC ................. H05K 9/0032; H05K 2201/0715
See application file for complete search history.

(56) References Cited

U.S. PATENT DOCUMENTS

| | | | | |
|---|---|---|---|---|
| 5,545,843 A * | 8/1996 | Arvidsson | ............ | H05K 9/0016 174/355 |
| 6,166,918 A * | 12/2000 | Olofsson | ............ | H05K 9/0032 174/361 |
| 7,113,410 B2 * | 9/2006 | Pawlenko | ............ | H05K 5/0013 174/32 |
| 8,222,542 B2 * | 7/2012 | Tseng | ............ | H05K 9/0032 174/382 |
| 2013/0048369 A1 * | 2/2013 | Malek | ............ | H05K 9/0032 174/377 |

FOREIGN PATENT DOCUMENTS

KR 20130068901 A 6/2013

* cited by examiner

*Primary Examiner* — Hung V Ngo

(57) ABSTRACT

A shield is provided. The shield includes a shield frame surrounding an electronic component mounted on a printed circuit board and a shield cover partially coupled to the shield frame. The shield frame includes a column part mounted on the printed circuit board and a bending part bent from an upper end portion of the column part. An angle between both end portions of the bending part is smaller than about 90 degrees.

13 Claims, 6 Drawing Sheets

SHIELD INSTALLED ON PRINTED CIRCUIT BOARD

CROSS-REFERENCE TO RELATED APPLICATION(S) AND CLAIM OF PRIORITY

The present application is related to and claims the benefit under 35 U.S.C. §119(a) of a Korean patent application filed on Sep. 2, 2014 in the Korean Intellectual Property Office and assigned Serial number 10-2014-0116323, the entire disclosure of which is hereby incorporated by reference.

TECHNICAL FIELD

The present disclosure relates to a shield surrounding at least one electronic component mounted on a printed circuit board.

BACKGROUND

As the technology advances, in recent, various electronic devices having a variety of functions have been suggested. For instance, a user listens to music using an MP3 player and takes a picture using a digital camera. In addition, the user makes a phone call or sends a message to another user using a mobile phone, e.g., a smart phone.

Each electronic device includes a printed circuit board therein and electronic components are mounted on the printed circuit board. However, in the case where the electronic devices are operated, interference occurs between the electronic components. Accordingly, a shield process is required to shield the electronic components.

SUMMARY

To address the above-discussed deficiencies, it is a primary object to provide at least the advantages described below. Accordingly, an aspect of the present disclosure is to provide a shield that surrounds at least one electronic component and to reduce a volume of the shield.

In accordance with an aspect of the present disclosure, a shield is provided. The shield includes a shield frame configured to surround an electronic component mounted on a printed circuit board and a shield cover partially coupled to the shield. The shield frame includes a column part mounted on the printed circuit board and a bending part bent from an upper end portion of the column part. An angle between both end portions of the bending part is smaller than about 90 degrees.

According to the various embodiments, the shield reduces the volume thereof, and thus the secured space due to the reduction in volume of the shield is used in various ways.

Other aspects, advantages, and salient features of the disclosure will become apparent to those skilled in the art from the following detailed description, which, taken in conjunction with the annexed drawings, discloses various embodiments of the present disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figure 1A:
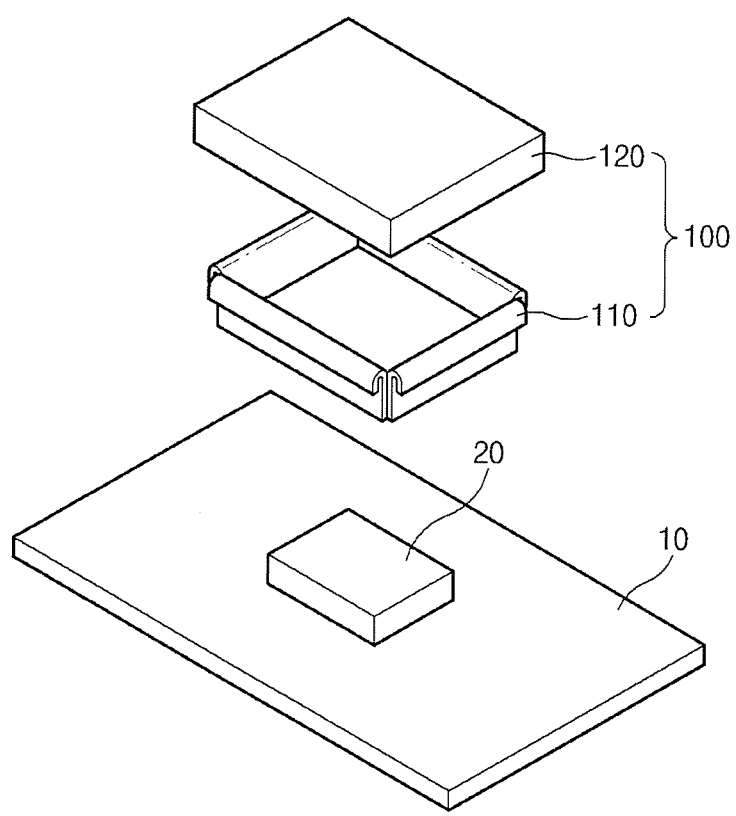
FIG. 1A illustrates an exploded perspective view showing a printed circuit board and a shield according to various embodiments of the present disclosure.

FIGS. 1A through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. Various embodiments of the present disclosure are described with reference to accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components are marked by similar reference numerals.

The term "include," "comprise," "including," or "comprising" used herein indicates disclosed functions, operations, or existence of elements but does not exclude other functions, operations or elements. It should be further understood that the term "include," "comprise," "have," "including," "comprising", or "having" used herein specifies the presence of stated features, integers, operations, elements, components, or combinations thereof but does not preclude the presence or addition of one or more other features, integers, operations, elements, components, or combinations thereof.

The meaning of the term "or" or "at least one of A and/or B" used herein includes any combination of words listed together with the term. For example, the expression "A or B" or "at least one of A and/or B" indicates A, B, or both A and B.

The terms, such as "first," "second," and the like used herein refer to various elements of various embodiments of the present disclosure, but do not limit the elements. For example, such terms do not limit the order and/or priority of the elements. Furthermore, such terms is used to distinguish one element from another element. For example, "a first electronic device" and "a second electronic device" indicate different electronic devices. For example, without departing the scope of the present disclosure, a first element is referred to as a second element, and similarly, a second element is referred to as a first element.

In the description below, when one part (or element, device, etc.) is referred to as being "connected" to another part (or element, device, etc.), it should be understood that the former can be "directly connected" to the latter, or "electrically connected" to the latter via an intervening part (or element, device, etc.). It will be further understood that when one component is referred to as being "directly connected" or "directly linked" to another component, it means that no intervening component is present.

Terms used in this specification are used to describe embodiments of the present disclosure and are not intended to limit the scope of the present disclosure. The terms of a singular form includes plural forms unless otherwise specified.

Unless otherwise defined herein, all the terms used herein, which include technical or scientific terms, include the same meaning that is generally understood by a person skilled in the art. It will be further understood that terms, which are defined in a dictionary and commonly used, should also be interpreted as is customary in the relevant related art and not in an idealized or overly formal sense unless expressly so defined herein in various embodiments of the present disclosure.

Electronic devices according to various embodiments of the present disclosure include a shield that will be described in detail with reference to FIGS. 1 to 5. For example, the electronic devices includes at least one of smart phones, smart pads, tablet personal computers (PCs), mobile phones, video phones, electronic book readers, desktop PCs, laptop PCs, netbook computers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), electronic apparels, electronic bracelets, electronic necklaces, electronic appcessories, smart watches, or the like.

According to various embodiments of the present disclosure, the electronic devices are smart home appliances including a shield. The smart home appliances includes at least one of, for example, televisions (TVs), digital versatile disc (DVD) players, audios, refrigerators, air conditioners, cleaners, ovens, microwave ovens, washing machines, air cleaners, set-top boxes, TV boxes (e.g., SAMSUNG HOMESYNC, APPLE TV, or GOOGLE TV), game consoles, digital signage (e.g., a smart mirror), humanoid robots, electronic dictionaries, electronic keys, camcorders, electronic picture frames, or the like.

In addition, the electronic device according to various embodiments of the present disclosure is, but not limited to, a flexible device. The electronic device according to various exemplary embodiments of the present disclosure should not be limited to the above-mentioned devices.

Hereinafter, the electronic device according to various embodiments of the present disclosure will be described in detail with reference to FIGS. 1 to 5. In the following description, the term of a "user" is referred to as a person or a device (e.g., an artificial intelligent electronic device) who or which uses the electronic device.

Figure 1B:
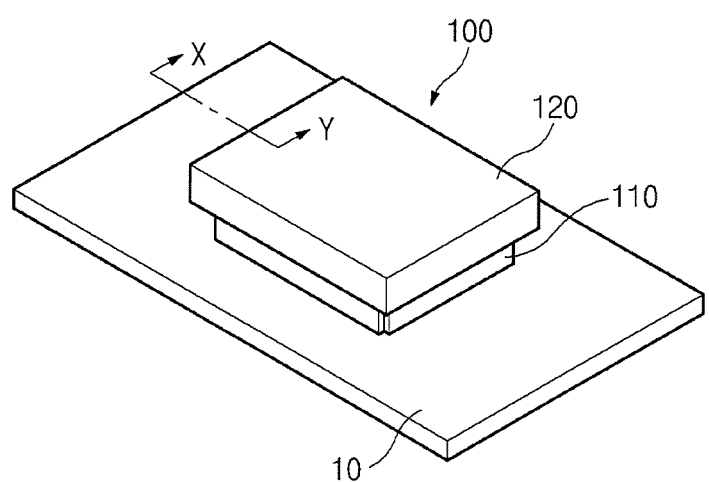
FIG. 1B illustrates the shield coupled to the printed circuit board of FIG. 1 according to various embodiments of the present disclosure.

FIG. 1A is an exploded perspective view showing a printed circuit board 10 and a shield 100 according to various embodiments of the present disclosure. FIG. 1B is a perspective view showing the shield 100 coupled to the printed circuit board 10 of FIG. 1 according to various embodiments of the present disclosure.

Referring to FIGS. 1A and 1B, an electronic device includes the printed circuit board 10, an electronic component 20 mounted on the printed circuit board 10, and the shield 100. In certain embodiments, the printed circuit board 10 includes a flexible printed circuit board. In addition, only one electronic component 10 is mounted on the printed circuit board 10 as shown in FIGS. 1A and 1B, but two or more electronic components is mounted on the printed circuit board 10. Accordingly, a plurality of shields is mounted on the printed circuit board 10.

According to various embodiments of the present disclosure, the shield 100 includes a shield frame 110 and a shield cover 120.

The shield frame 110 is disposed on the printed circuit board 10. In addition, the shield frame 110 surrounds the electronic component 20. The shield frame 110 includes an opening formed therethrough to surround the electronic component 20. In certain embodiments, the shield frame 110 includes an inner surface area wider than a surface area of the electric component 20 and a height greater than a height of the electronic component 20.

The shield cover 120 is disposed to cover the shield frame 110. In certain embodiments, since a height of the shield cover 120 is smaller than the height of the shield frame 110, the shield cover 120 have a shape to cover only an upper portion of the shield frame 110 in the case where the shield cover 120 is installed at the shield frame 110. However, according to various embodiments, the height of the shield cover 120 is substantially equal to the height of the shield frame 110.

Although not shown in FIGS. 1A and 1B, the shield cover 120 is coupled to the shield frame 110 to prevent the shield cover 120 from being easily separated from the shield frame 110 covered by the shield cover 120.

Referring to FIGS. 1A and 1B, one shield 100 covers one electronic component 20 mounted on the printed circuit board 10, but one shield 100 covers two or more electronic components according to various embodiments.

In addition, the shield 100 shown in FIG. 1A includes a substantially rectangular parallelepiped shape, however the shield 100 includes various shapes in accordance with a shape of the electronic component 20 or an arrangement of the electronic components 20 surrounded by the shield 100.

Further, the shield frame 110 is disposed on the printed circuit board 10 after the electronic component 20 is mounted on the printed circuit board 10, however the electronic component 20 is mounted on the printed circuit board 10 after the shield frame 110 is disposed on the printed circuit board 10.

Hereinafter, a structure of the shield 100 will be described in detail with reference to FIG. 2.

Figure 2:
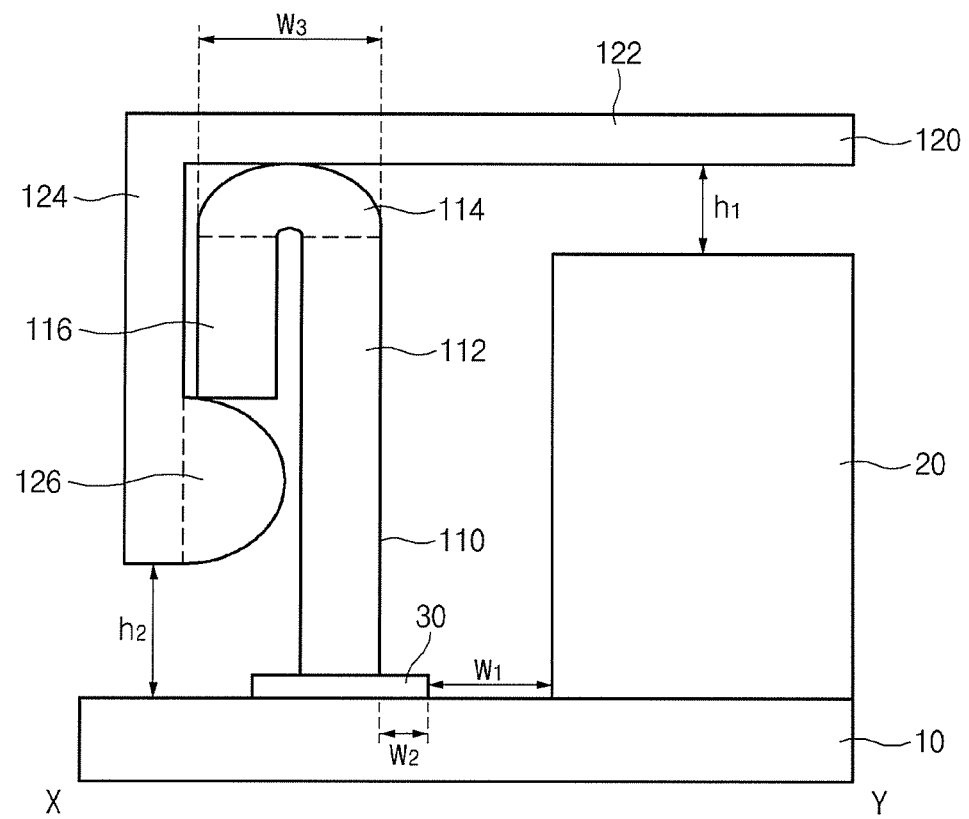
FIG. 2 illustrates a shield according to various embodiments of the present disclosure.

FIG. 2 is a view showing a shield 100 according to various embodiments of the present disclosure. FIG. 2 shows a cross-sectional view taken along cross-section line X-Y in FIG. 1B. Referring to FIG. 2, a shield frame 110 includes a column part 112, a bending part 114, and an extending part 116. A shield cover 120 includes an upper plate part 122, a sidewall part 124, and a protruding part 126.

The column part 112 of the shield frame 110 is disposed on a printed circuit board 10. For instance, a lower end portion of the column part 112 is disposed on the printed circuit board 10 such that a pad 30 disposed on the printed circuit board 10 is disposed between the printed circuit board 10 and the column part 112. In certain embodiments, the pad 30 includes a solder mask defined (SMD) pad, a non-solder mask define (NSMD) pad, etc.

However, a predetermined distance $W_1$ exists between the pad 30 and the electronic component 20 since a solder ball is soldered on the pad 30. This is to prevent the solder ball from making contact with the electronic component 20. In certain embodiments, the predetermined distance $W_1$ is about 0.3 mm. Therefore, since the column part 112 is spaced apart from the electronic component 20 by a sum of the distance $W_1$ and a distance $W_2$, the column part 112 is spaced apart from the electronic component 20 by the distance equal to or greater than about 0.3 mm.

According to various embodiments of the present disclosure, the column part 112 is directly coupled to the printed circuit board 10 without the pad 30 by vertically disposing the column part 112 on the printed circuit board 10.

The bending part 114 of the shield frame 110 is bent from an upper end portion of the column part 112. For instance, the bending part 114 is bent from the upper end portion of the column part 112, which is opposite to the lower end portion of the column part 112 disposed on the printed circuit board 10 or the pad 30, while extending outward from the upper end portion of the column part 112. In certain embodiments, an angle between both end portions of the bending part 114 is smaller than 90 degrees. FIG. 2 shows that the angle between the both end portions of the bending part 114 is 0 degree, however according to various embodiments of the present disclosure, the angle between the both end portions of the bending part 114 is an acute angle exceeding 0 degrees and smaller than 90 degrees. In addition, according to other various embodiments of the present disclosure, the bending part 114 is much more bent toward the column part 112 than the bending part 114 shown in FIG. 2, and thus a lower end portion of the extending portion 116 is disposed adjacent to or make contacts with the column part 112.

According to various embodiments of the present disclosure, the bending part 114 is bent from the upper end portion of the column part 112 while extending inward from the upper end portion of the column part 112 along a direction from the column part 112 to the electronic component 20. This will be described in detail below with reference to FIG. 3.

The extending part 116 of the shield frame 110 extends from the other end portion of the bending part 114, which is opposite to one end portion of the bending part 114 bent from the column part 112. In certain embodiments, a direction in which the extending part 116 extends depends on a direction to which the other end of the bending part 114 faces. For example, in the case where the bending part 114 is bent such that the angle between the both ends of the bending part 114 becomes about 0 degree, the extending part 116 extends in the direction toward the printed circuit board 10 to allow the extending part 116 to be substantially parallel to the column part 112 as shown in FIG. 2. If the bending part 114 is bent such that the angle between the both ends of the bending part 114 becomes about 45 degrees, the extending part 116 extends in a direction inclined at about 45 degrees with respect to the column part 112.

The upper plate part 122 of the shield cover 120 is, but not limited to, a flat plate and at least a portion of the upper plate part 122 is placed on the bending part 114. In certain embodiments, the bending part 114 includes a predetermined width $W_3$ to prevent flatness of the upper plate part 122 from being degraded due to the portion of the upper plate part 122 placed on the bending part 114. The width $W_3$ is about 0.4 mm.

The upper plate part 122 is located at a predetermined height $h_1$ from the electronic component 20 to prevent an operation of the electronic component 20 from being influenced by the operation of the other electronic components, or vice versa. The height $h_1$ is about 0.2 mm. For similar reasons, the upper plate part 122 is placed on the bending part 114 of the shield frame 110 without a separation from all the portions of the bending part 114 of the shield frame 110.

The sidewall part 124 of the shield cover 120 extends toward the printed circuit board 10 from an edge of the upper plate part 122. In FIG. 2, the sidewall part 124 extends at a right angle from the upper plate part 122. However, according to various embodiments of the present disclosure, the sidewall part 124 extends from the upper plate part 122 to have a curved surface with an arc shape.

The sidewall part 124 is disposed to surround the shield frame 110. For instance, the sidewall part 124 is disposed to surround the extending part 116 of the shield frame 110. Referring to FIG. 2, the sidewall part 124 and the extending part 116 is slightly spaced apart from each other, but they should not be limited there to or thereby. That is, the sidewall part 124 and the extending part 116 make contact with each other according to another embodiment.

The protruding part 126 of the shield cover 120 is protruded inward from the sidewall part 124 toward the shield frame 110. The sidewall part 126 is disposed at a position to be engaged with the lower end portion of the extending part 116. Since the bending part 114 includes the curved surface having the arc shape rather than a flat shape, the protruding part 126 moves downward along the extending part 116 after sliding on the curved surface of the bending part 114, and thus the protruding part 126 is engaged with the lower end portion of the extending part 116.

As shown in FIG. 2, the protruding part 126 is protruded from an edge of the sidewall part 124. However, according to various embodiments, the protruding part 126 is located at a predetermined position spaced apart from the lower end portion of the sidewall part 124. This will be described in detail later with reference to FIG. 3. As another way, the protruding part 126 is formed in a band shape continuously in a direction substantially parallel to the printed circuit board 10 when viewed from the entire surface of the shield cover 120 rather than one cross-sectional surface of the shield cover 120, or is formed in a discontinuous dot-like pattern in the direction substantially parallel to the printed circuit board 10.

The protruding part 126 is located at a predetermined height h2 from an upper surface of the printed circuit board 10. Although not shown in FIG. 2, the solder ball soldered on the pad 30 exists on the pad 30 and the solder ball soldered on the pad 30 includes a predetermined height. Accordingly, in the case where the height of the solder ball is not considered, the protruding part 126 may not be properly engaged with the lower end portion of the extending part 116 due to the solder ball. Similarly, the extending part 116 includes a length determined to allow the protruding part 126 to be located at the predetermined height h2 from the upper surface of the printed circuit board 10. According to various embodiments, different from the protruding part 126, the lower end portion of the sidewall part 124 is located at a position lower than the protruding part 126 since the sidewall part 124 is not disposed directly adjacent to the pad 30. However, in the case where the height of the sidewall part 124 is higher than the height of the shield frame 110, the lower end portion of the sidewall part 124 is required to make contact with the printed circuit board 10 or to be located at a predetermined height from the printed circuit board 10 since the upper plate part 122 is spaced apart from the bending part 114.

Figure 3:
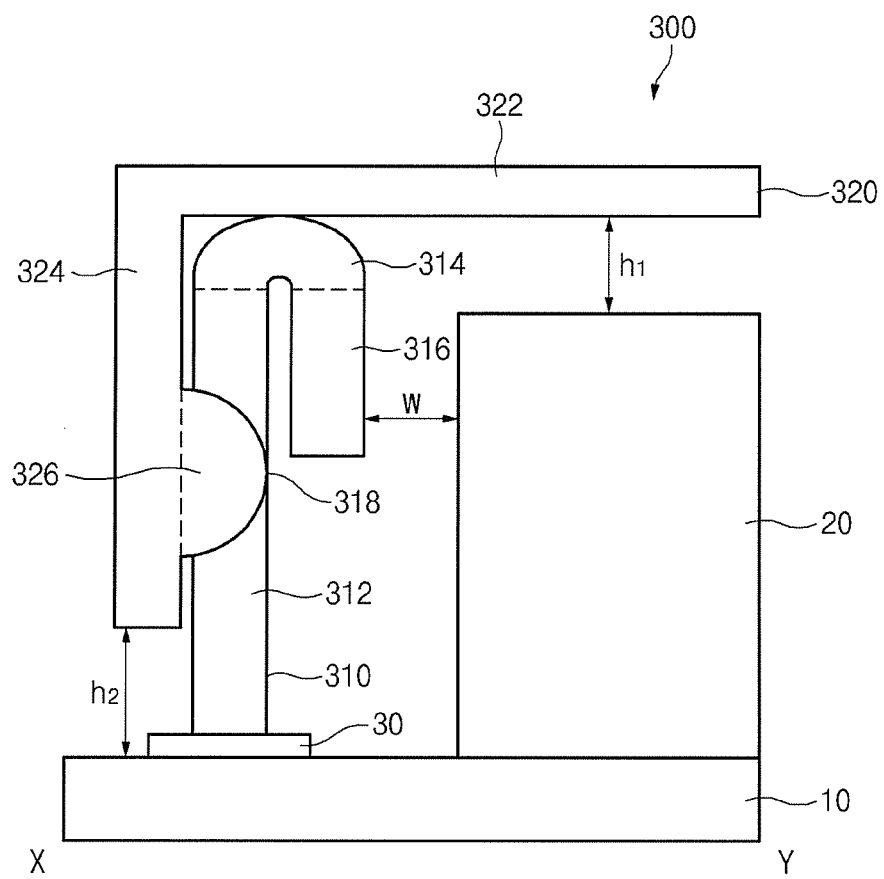
FIG. 3 illustrates a shield according to other various embodiments of the present disclosure.

FIG. 3 is a view showing a shield 300 according to other various embodiments of the present disclosure. Similar to the shield 100 shown in FIG. 2, the shield 300 shown in FIG. 3 includes a shield frame 310 and a shield cover 320. In addition, the shield frame 310 includes a column part 312, a bending part 314, an extending part 316, and a recess part 318 and the shield cover 320 includes an upper plate part 322, a sidewall part 324, and a protruding part 326. In FIG. 3, the same reference numerals denote the same elements in FIG. 2, and thus detailed descriptions of the same elements will be omitted.

The bending part 314 of the shield frame 310 is bent from an upper end portion of the column part 312 while extending inward from the upper end portion of the column part 312 along a direction from the column part 312 to the electronic component 20. Therefore, the extending part 316 of the shield frame 310, which extends from the bending part 314, is disposed between the column part 312 and the electronic component 20.

In the embodiment shown in FIG. 3, since the extending part 316 is disposed at an inner side than the pad 30, the protruding part 326 of the shield cover 320 may not be engaged with the column part 312 or the extending part 316. Thus, the shield frame 310 further includes the recess part 318 formed by recessing a portion of the column part 312. In certain embodiments, the recess part 312 includes a shape corresponding to a shape of the protruding part 326.

In addition, since the extending part 316 is disposed at an inner side than the pad 30, a distance w between the extending part 316 and the electronic component 20 may not need to be considered. Accordingly, when compared with the shield 100 shown in FIG. 2, the distance w (e.g., about 0.3 mm) between the shield frame 310 and the electronic component 20 is shorter than that of the shield 100 shown in FIG. 2.

The sidewall part 324 of the shield cover 320 is located at a predetermined height h2 from an upper surface of the printed circuit board 10. Since the extending part 316 is disposed at an inner side than the pad 30, the sidewall part 324 is disposed adjacent to the column part 312, and thus the sidewall part 324 is disposed adjacent to the pad 30. Similar to the descriptions with reference to FIG. 2, the solder ball soldered on the pad 30 comprises the predetermined height, and thus the sidewall part 324 is located at the predetermined height h2 from the upper surface of the printed circuit board 10 to allow the shied cover 320 to be properly coupled to the shield frame 310.

As described above, the protruding part 326 of the shield cover 320 is engaged with the recess part 318. Similarly, the protruding part 126 of the shield cover 120 shown in FIG. 2 is engaged with a recess part (not shown) formed in the extending part 116 rather than the lower end portion of the extending part 116.

According to FIG. 3, the protruding part 326 is engaged with the recess part 318 from the outside of the column part 312 to reach an inner portion of the column part 312, but it should not be limited thereto or thereby. The protruding part 326 is engaged with the column part 312 to reach a center portion of the column part 312 (refer to FIG. 4) or a portion of the protruding part 326 penetrates through the column part 312. For this end, the recess part 318 includes a hole formed therethrough.

According to various embodiments of the present disclosure, the column part 312 includes a protruding part (not shown) and the sidewall part 326 includes a recess part (not shown). In certain embodiments, the protruding part of the column part 312 is engaged with the recess part of the sidewall part 326, and thus the shield cover 320 is fixed to the shield frame 310.

According to various embodiments of the present disclosure, the bending part 114 is bent two times. Hereinafter, the embodiment in which the bending part 114 is bent two times will be described in detail with reference to FIG. 4.

Figure 4:
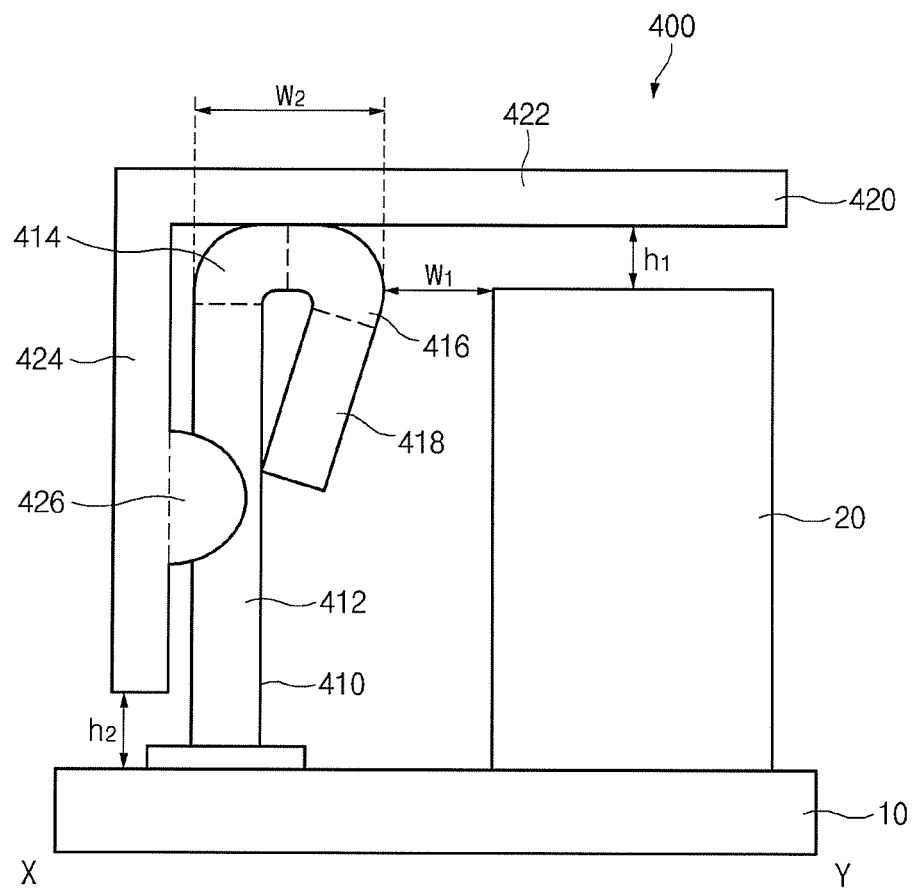
FIG. 4 illustrates a shield according to other various embodiments of the present disclosure.

FIG. 4 is a view showing a shield 400 according to other various embodiments of the present disclosure. The shield 400 shown in FIG. 4 includes a shield frame 410 and a shield cover 420. In FIG. 4, the same reference numerals denote the same elements in FIGS. 2 and 3, and thus detailed descriptions of the same elements will be omitted.

The shield frame 410 includes a bending part bent two times or more. For the convenience of explanation, a part, which is firstly bent, is referred to as a first bending part 414 and a part, which is secondary bent, is referred to as a second bending part 416.

The first bending part 414 is bent inward from an upper end portion of the column part 412. In addition, the second bending part 416 is bent toward the column part 412 after the second bending part 416 extends inward from the first bending part 414.

In certain embodiments, a distance $W_1$, e.g., about 0.3 mm, between the shield frame 410 and the electronic component 20 is measured from one end portion of the second bending part 416 disposed at an innermost position of the shield frame 410.

In addition, the bending part including the first and second bending parts 414 and 416 has a thickness $W_2$ of about 0.5 mm.

According to various embodiments of the present disclosure, the second bending part 416 is directly bent from the column part 412 without extending from the first bending part 414. In certain embodiments, the shield frame 410, according to the present embodiment shown in FIG. 4, corresponds to the shield frame 110 shown in FIG. 2.

In addition, as a difference between the shield 300 shown in FIG. 3 and the shield 400 shown in FIG. 4, the protruding part 426 reaches the center portion of the column part 412.

Figure 5:
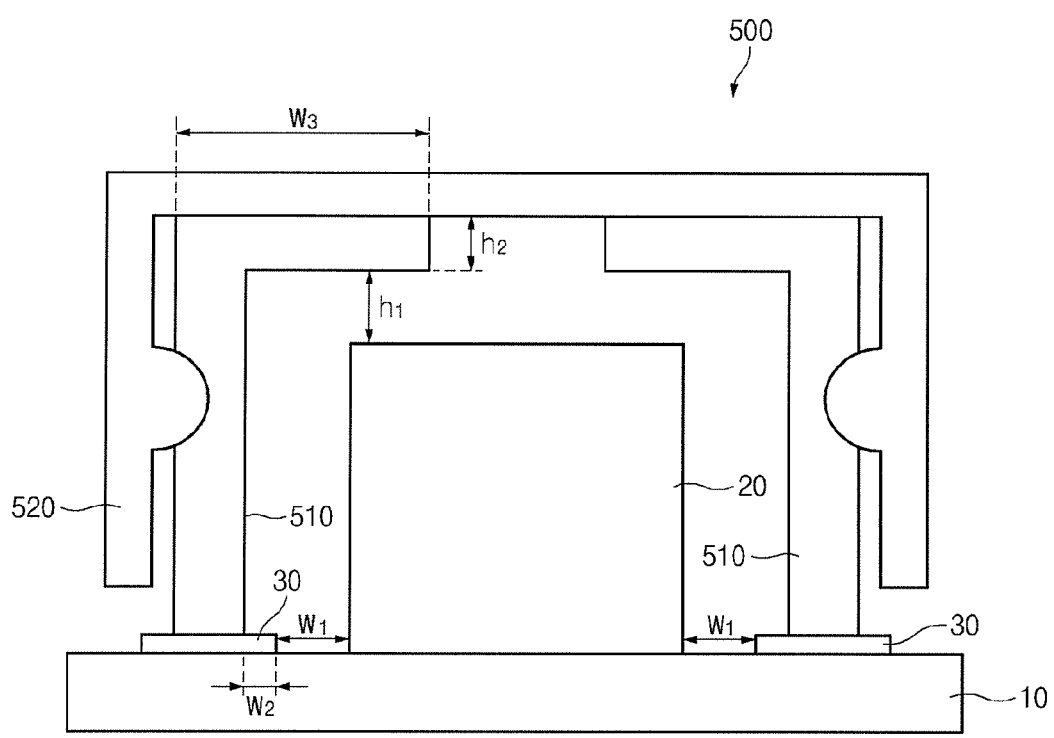
FIG. 5 illustrates a conventional shield.

FIG. 5 is a view showing a conventional shield 500. Referring to FIG. 5, the shields 100, 300, and 400 described with reference to FIGS. 1 to 4 according to various embodiments of the present disclosure are realized on the printed circuit board 10 in a relatively small space compared with the shield 500 shown in FIG. 5.

The conventional shield 500 includes a column part similar to that of the shield 100 shown in FIG. 2. However, both end portions of a bending part of the shield 500 are formed to have an angle of about 90 degrees and an extending part extends inward from the bending part. In certain embodiments, a shield cover 520 is supported by the bending part and the extending part. The bending part and the extending part have a predetermined length w3 of about 0.8 mm, which is obtained by adding a length of the bending part to a length of the extending part in order to maintain flatness of the shield frame 510. Accordingly, the conventional shield 500 requires much more space than the shields according to various embodiments of the present disclosure, and thus the space for the shield 500 is wasted.

In addition, since the length obtained by adding the length of the bending part to the length of the extending part is relatively longer than that of the shields according to various embodiments of the present disclosure, the extending part is spaced apart from an upper portion of an electronic component 20 by a predetermined distance h1 while covering the upper portion of the electronic component 20. Therefore, in case of the conventional shield 500, the space corresponding to a thickness h2 of the extending part is wasted.

Each of the above-mentioned elements of the electronic device according to various embodiments of the present disclosure is configured with one or more components, and the names of the elements are changed according to the type of the electronic device. The electronic device according to various embodiments of the present disclosure includes at least one of the above-mentioned elements, and some elements are omitted or other additional elements are added. Furthermore, some of the elements of the electronic device according to various embodiments of the present disclosure are combined with each other so as to form one entity, so that the functions of the elements are performed in the same manner as before the combination.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A shield comprising:
    a shield frame configured to surround an electronic component mounted on a printed circuit board, wherein the shield frame comprises:
        a column part mounted on the printed circuit board;
        a bending part bent from an upper end portion of the column part, wherein an angle between both end portions of the bending part is smaller than about 90 degrees; and
        a shield cover at least partially coupled to the shield frame,
    wherein the shield frame further comprises an extending part extended from the bending part and a lower end portion of the extending part is located at a predetermined height from the printed circuit board,
    wherein the extending part is substantially parallel to the column part, and
    wherein the shield cover further comprises:
        an upper plate part in which at least a portion thereof is disposed above the bending part of the shield frame; and
        a sidewall part that extends toward the printed circuit board from an end portion of the upper plate part,
    wherein the sidewall part of the shield cover comprises a protruding part that inwardly protrudes and the sidewall part is disposed at a position to be engaged with the lower end portion of the extending part.

2. The shield of claim 1, wherein the bending part is bent one time.

3. The shield of claim 1, wherein the sidewall part of the shield cover is disposed to surround the shield frame.

4. The shield of claim 1, wherein the protruding part of the shield frame is located at a predetermined height from the printed circuit board.

5. The shield of claim 1, wherein the extending part of the shield frame is disposed outside the column part.

6. The shield of claim 1, wherein extending part of the shield frame comprises a recess part located at a predetermined height from the lower end portion of the extending part, and the protruding part engages with the recess part.

7. The shield of claim 1, wherein the column part of the shield frame comprises a recess part located at a predetermined height from the printed circuit board, and the protruding part is engaged with the recess part.

8. The shield of claim 7, wherein the extending part of the shield frame is disposed inside the column part.

9. The shield of claim 1, wherein the bending part is bent at least two times.

10. The shield of claim 9, wherein the shield frame comprises an extending part configured to extend from the bending part and the extending part extends toward the column part.

11. The shield of claim 9, wherein the bending part is bent from an upper end portion toward an inside of the column part and bent from an end portion of the bending part, which is bent toward an inside of the column part, to the column part.

12. An apparatus comprising:
    a printed circuit board;
    an electronic component mounted on the printed circuit board; and
    a shield comprising:
        a shield frame configured to surround the electronic component mounted on the printed circuit board, wherein the shield frame comprises:
            a column part mounted on the printed circuit board;
            a bending part bent from an upper end portion of the column part, wherein an angle between both end portions of the bending part is smaller than about 90 degrees; and
            a shield cover at least partially coupled to the shield frame,
    wherein the shield frame further comprises an extending part extended from the bending part and a lower end portion of the extending part is located at a predetermined height from the printed circuit board,
    wherein the extending part is substantially parallel to the column part, and
    wherein the shield cover further comprises:
        an upper plate part in which at least a portion thereof is disposed above the bending part of the shield frame; and
        a sidewall part that extends toward the printed circuit board from an end portion of the upper plate part,
    wherein the sidewall part of the shield cover comprises a protruding part that inwardly protrudes and the sidewall part is disposed at a position to be engaged with the lower end portion of the extending part.

13. The apparatus of claim 12, wherein the bending part is bent one time.

* * * * *